United States Patent [19]
Takada et al.

[11] Patent Number: 5,942,788
[45] Date of Patent: *Aug. 24, 1999

[54] SOLID STATE IMAGE SENSING DEVICE

[75] Inventors: Kenji Takada, Itami; Kouichi Ishida, Sakai; Keiichi Nomura, Tsuchiura; Yoshihiro Hamakawa; Hiroaki Okamoto, both of Kawanishi, all of Japan

[73] Assignee: Minolta Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/640,447

[22] Filed: Apr. 30, 1996

[30] Foreign Application Priority Data

May 9, 1995 [JP] Japan ................... 7-110900

[51] Int. Cl.$^6$ .................. H01L 31/107; H01L 31/00; H01L 31/075; H01L 31/105
[52] U.S. Cl. ................. 257/438; 257/444; 257/458; 257/461; 257/463; 257/466
[58] Field of Search ....................... 257/438, 458, 257/459, 461, 463, 466, 76, 77, 443, 444, 290–291, 292, 293; 438/91

[56] References Cited

U.S. PATENT DOCUMENTS

| | | | |
|---|---|---|---|
| 5,101,255 | 3/1992 | Ishioka et al. | 357/30 |
| 5,241,575 | 8/1993 | Miyatake et al. | 377/60 |
| 5,365,087 | 11/1994 | Sasaki | 257/184 |
| 5,401,986 | 3/1995 | Cockrum et al. | 257/188 |
| 5,444,274 | 8/1995 | Sasaki | 257/184 |
| 5,481,124 | 1/1996 | Kozuka et al. | 257/185 |
| 5,486,711 | 1/1996 | Ishida | 257/258 |
| 5,523,610 | 6/1996 | Kudo et al. | 257/443 |
| 5,557,114 | 9/1996 | Leas et al. | 257/59 |
| 5,581,099 | 12/1996 | Kusaka | 257/222 |
| 5,589,007 | 12/1996 | Fujioka et al. | 136/249 |
| 5,656,835 | 8/1997 | Komobuchi | 257/232 |

Primary Examiner—Mahshid Saadat
Assistant Examiner—Allan R. Wilson
Attorney, Agent, or Firm—Burns, Doane, Swecker & Mathis, LLP

[57] ABSTRACT

A solid state image sensing device having a semiconductor substrate, a first diffusion region of a positive or negative conductive type provided on the semiconductor substrate, a plurality of second diffusion regions each of which is an opposite conductive type relative to the first diffusion region and is provided in the first diffusion region, and a semiconductor thin layer provided on at least the second diffusion regions.

30 Claims, 15 Drawing Sheets

SOLID STATE IMAGE SENSING DEVICE

BACKGROUND OF THE INVENTION

1. Field of the Invention

The present invention relates to a solid state image sensing device and solid state image sensing device production method, and more specifically relates a solid state image sensing device using semiconductor thin layers laminated on a semiconductor substrate as a photoelectric conversion element, and method for producing said device.

2. Description of the Related Art

Unidimensional solid state image sensing devices for use in facsimile machines, image scanners, and digital copiers and the like, and two-dimensional solid state image sensing devices for use in video cameras have been proposed as solid state image sensing devices in conventional image forming apparatuses.

In recent years, there has been a demand for high resolution images formed by image forming apparatuses using the aforesaid solid state image sensing devices. To satisfy these demands, the picture element size of the solid state image sensing device must be very small. When the size of the picture elements is very small, however, the sensitivity of the solid state image sensing device is insufficient.

Consider a construction of an intensifying layer for intensifying a photocurrent superimposed over a photoreceptor as a construction which eliminates the previously described disadvantages.

U.S. Pat. No. 5,101,255 discloses a unidimensional long sensor comprising a glass substrate on which is superimposed a readout electrode, $CeO_2$ thin layer as a rectifying contact auxiliary layer, noncrystalline Se layer as a photoconductive layer, and a light-transmitting conductive layer. In this unidimensional long sensor, a non-crystalline Se layer is superimposed over a glass substrate as a photoconductive layer, and a strong electric field is applied to the noncrystalline layer so as to generate a charge intensifying action within the noncrystalline layer, thereby increasing the sensitivity of the noncrystalline layer.

In this unidimensional long sensor, however, the bed of the photoconductive layer is not flat because a readout electrode is provided on the glass substrate. When the bed is not flat as in this example, there is variance generated in the electrical output of the sensor because the layer thickness is nonuniform.

When a semiconductor thin layer is superimposed as in the aforesaid unidimensional long sensor, defects occur in the interface of the laminate portion, which generates dark current and adversely affects voltage resistance characteristics. Furthermore, if the substrate is a semiconductor substrate, an injection current is generated from the substrate.

SUMMARY OF THE INVENTION

A main object of the present invention is to provide a solid state image sensing device having a high degree of photoreceptivity, and a method for producing said device.

Another object of the present invention is to provide a solid state image sensing device of a laminate type having a high degree of photoreceptivity, and a method for producing said device.

Yet another object of the present invention is to provide a solid state image sensing device of a laminate type which produces an output with a small dark current component, and a method for producing said device.

These objects of the present invention are attained by providing a solid state image sensing device comprising:

a semiconductor substrate;

a first diffusion region of a positive or negative conductive type provided on said semiconductor substrate;

a plurality of second diffusion regions each of which is an opposite conductive type relative to said first diffusion region and is provided in said first diffusion region; and semiconductor thin layer provided on at least said second diffusion regions.

These objects of the present invention are attained by providing a solid state image sensing device comprising:

a semiconductor substrate;

semiconductor thin layer having a plurality of layers formed on a semiconductor substrate, and among said plurality of layers a first layer provided on said semiconductor substrate and a second layer provided on said first layer are formed by different semiconductor materials without doping.

These objects of the present invention are attained by providing a method for producing a solid state image sensing device, said method comprising:

providing a semiconductor substrate;

processing the surface of said semiconductor substrate by hydrogen plasma; and forming a semiconductor thin layer on said semiconductor substrate.

These and other objects, advantages and features of the invention will become apparent from the following description thereof taken in conjunction with the accompanying drawings which illustrate specific embodiments of the invention.

BRIEF DESCRIPTION OF THE DRAWINGS

In the following description, like parts are designated by like reference numbers throughout the several drawings.

DETAILED DESCRIPTION OF THE PREFERRED EMBODIMENTS

Figure 1:
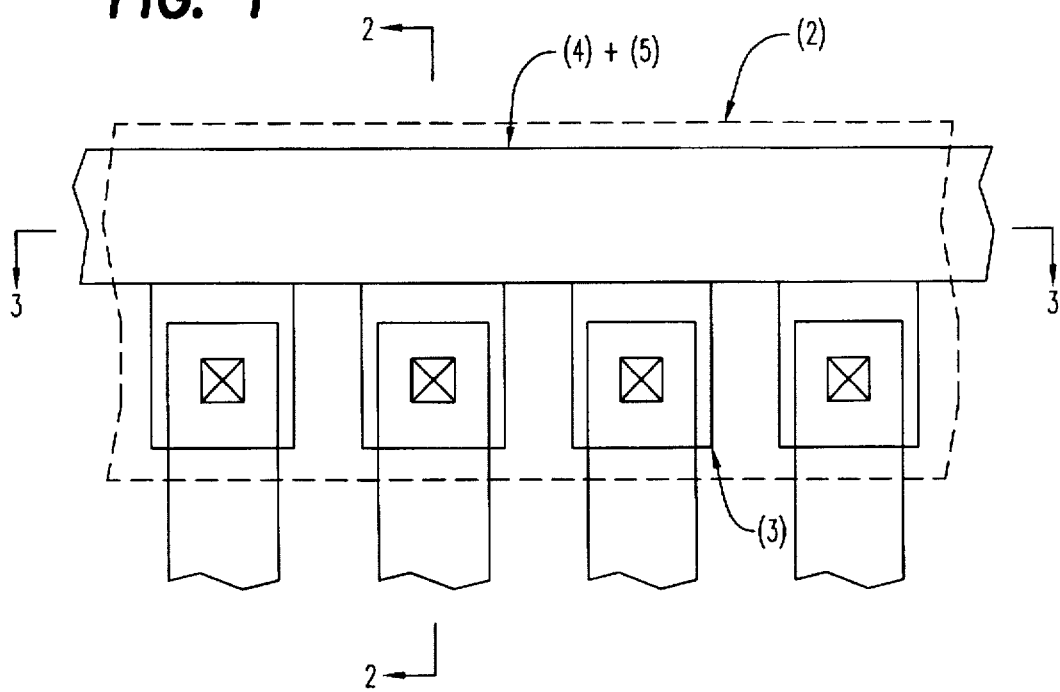
FIG. 1 is a plan view showing the construction of the picture elements of a unidimensional solid state image sensing device as a first embodiment according to the present invention.
Figure 2:
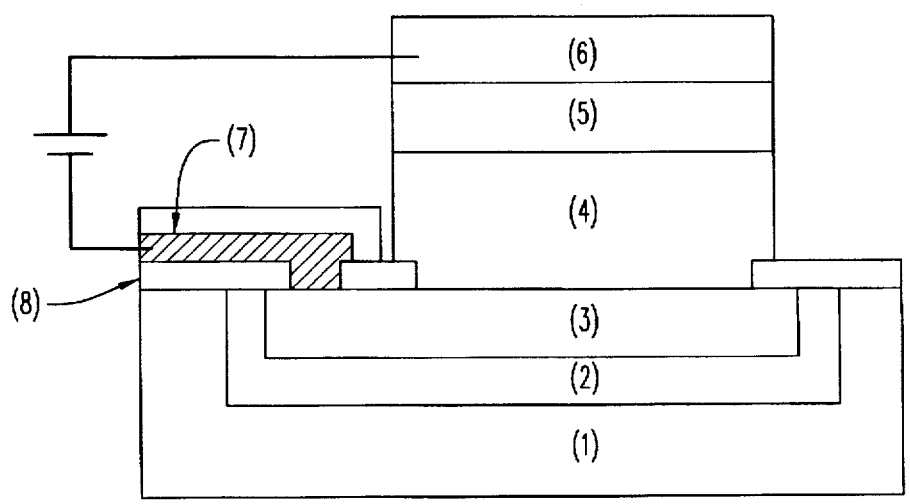
FIG. 2 shows a Y–Y' section view of the device of FIG. 1.
Figure 3:
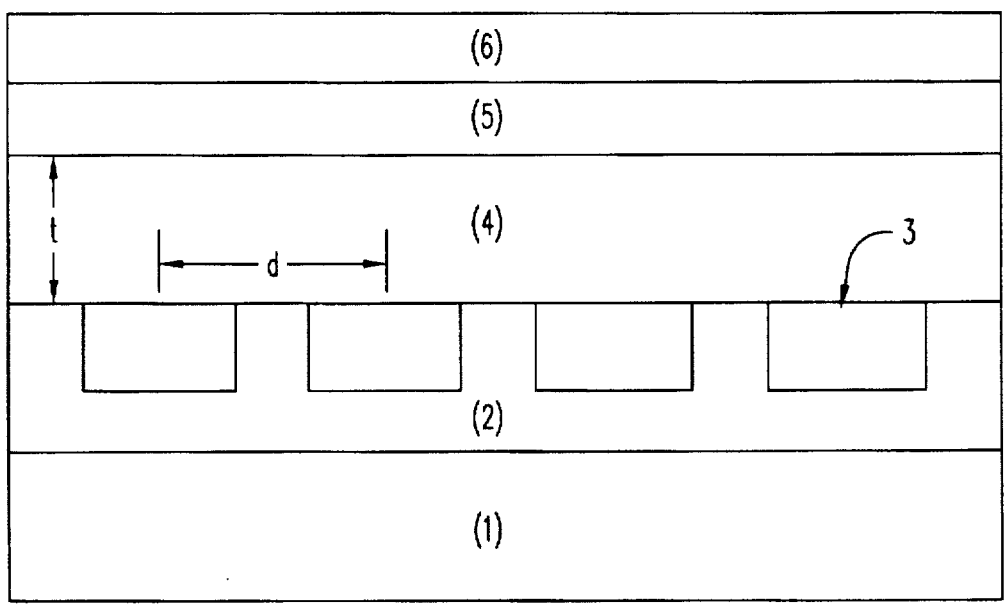
FIG. 3 shows a X–X' section view of the device of FIG. 1.

FIG. 1 is a plan view showing the construction of the picture element portion of a unidimensional solid state image sensing device as a first embodiment according to the present invention. FIG. 2 shows a Y-Y' section view, and FIG. 3 shows an X-X' section view of the device of FIG. 1. In these drawings, reference number (1) refers to a p-type substrate, reference number (2) refers to an n well region formed on the p-type substrate by ion implantation or thermal diffusion, reference number (3) refers to a p-type impurity layer formed in the n well region (2) by ion implantation or thermal diffusion, reference number (4) refers to an i-type semiconductor thin layer (an i-type semiconductor thin layer is formed of semiconductor materials without doping) used as a photoelectric conversion layer, reference number (5) refers to an n-type semiconductor thin layer, reference number (6) refers to a light-transmissible electrode, and reference number (7) refers to an Al (Aluminum) electrode. The i-type semiconductor thin layer (4) is formed of a-Si:H, μc-Si, polysilicon, or monocrystalline Si layer having a high resistance and a large visible light absorption coefficient. The n-type semiconductor thin layer (5) transmits incidence light and is formed of electrically conductive material. Examples of materials usable for the n-type semiconductor thin layer (5) include a-SiC, a-SiC:H, μc-SiC:H, and μc-Si:H and the like which are used in solar batteries and the like. The materials such as a-Si and the like which have a band gap broader than silicon are particularly useful. Light-transmissible electrode (6) may be constructed of ITO, $SnO_2$ and the like. The light transmitted through the light-transmissible electrode (6) is absorbed by the i-type semiconductor thin layer (4), and produces electron-hole pairs. Since a positive polarity voltage is applied to light-transmissible electrode (6), the generated holes migrate toward the p-type semiconductor thin layer (3), and electrons migrate toward light-transmissible electrode (6). The carrier generated in the i-type semiconductor thin layer (4) is fetched as a photocurrent by the Al electrode (7). Al electrode (7) is connected to a CCD analog shift register, logarithmic conversion circuit such as disclosed in U.S. Pat. No. 5,241,575 or the like (not illustrated).

Reference number (8) refers to an insulation layer formed of a thermal oxidation layer such as $SiO_2$, or SiN.

In the first embodiment, the picture element electrode provided in conventional solid state image sensing devices is unnecessary because picture element separation is accomplished by p-type impurity diffusion layer (3). Furthermore, the p-type impurity diffusion layer (3) is provided within the n well region (2), such that the i-type semiconductor thin layer (4) makes direct contact with both the p-type impurity diffusion layer (3) and the n well region (2), and the bed of the i-type semiconductor thin layer (4) is flat. Accordingly, the occurrence of dispersion in the electrical output of the sensor due to the non-flat bed of the photoelectric conversion layer as in conventional laminate-type solid state image sensing devices can be prevented.

FIG. 3 shows one picture element formed by a p-type impurity diffusion layer (3) formed within an n well region (2), with a plurality of said picture elements being arrayed in a horizontal direction. The picture element portion of the unidimensional solid state image sensing device comprises a plurality of photoelectric conversion portions respectively corresponding to the picture elements. FIG. 3 further shows the connected configuration of each picture element of the top laminate layer is formed so as to be in contact with both the n well region (2) and p-type impurity diffusion layer (3). The carrier generated by photoelectric conversion in the i-type semiconductor thin layer (4) arrives at the p-type impurity diffusion layer (3) without diffusion in a horizontal direction because of the high resistance of the i-type semiconductor thin layer (4) and the long distance d between picture elements compared to the thickness t of the thin layers. Concretely, the distance d is about between 5 and 10 μm, and the thickness t is about 1 μm as shown in FIG. 3.

Figure 4:
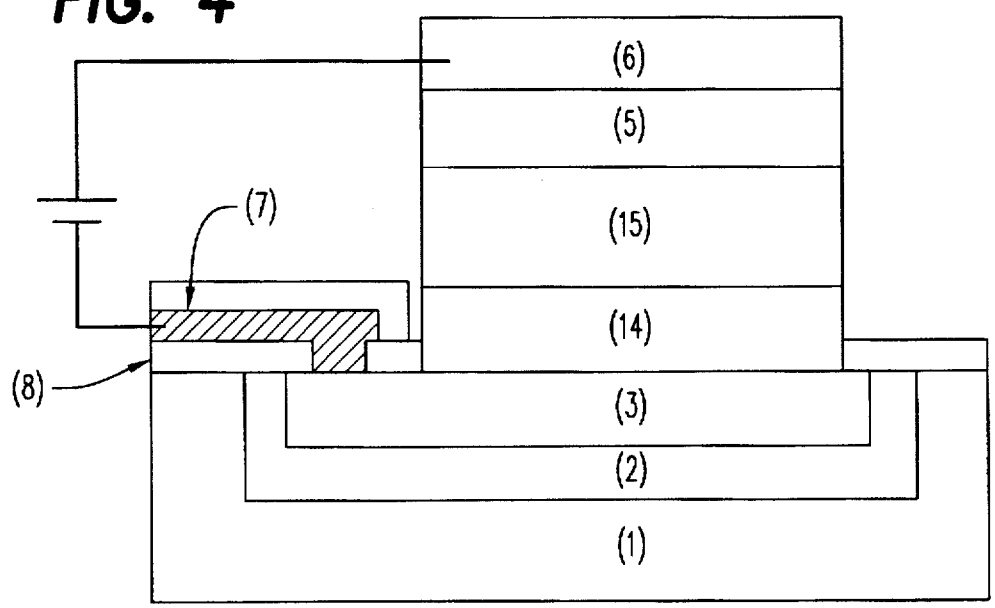
FIG. 4 shows the construction of the picture elements of a solid state image sensing device as a second embodiment according to the present invention.

FIG. 4 shows the construction of the picture element portion of a solid state image sensing device as a second embodiment according to the present invention. In the second embodiment, the i-type semiconductor thin layer has a two-layer construction comprising a first i-type semiconductor thin layer (14) and a second semiconductor thin layer (15), whereas in the first embodiment the i-type semiconductor thin layer has a monolayer construction directly superimposed on an n well region and a p-type impurity diffusion layer formed within said n well region. In other respects the construction of the device of the second embodiment is identical to the device as the first embodiment.

In the second embodiment, the first i-type semiconductor thin layer (14) suppresses dark current generated by defects in the interface between the semiconductor thin layer and the n well region (2) and p-type impurity diffusion layer (3), improves the voltage resistance characteristics of the semiconductor thin layer, and functions as a blocking layer to block an injection current from the p-type impurity diffusion layer (14). Since the provision of the first i-type semiconductor thin layer (14) allows the application of the high voltage required for photocurrent intensification such as avalanche intensification in the second i-type semiconductor thin layer which is a photoelectric conversion layer, the generation of dark current can be suppressed and photocurrent intensification such as avalanche intensification can be accomplished.

The second semiconductor thin layer (15) which is a photoelectric conversion layer if formed by material such as a-Si:H, μc-Si:H, polysilicon or the like having a large visible light absorption coefficient. The first i-type semiconductor thin layer (14) is formed of polysilicon, μc-Si, μc-Si:H, a-SiC:H, μc-SiC:H, a-SiN:H, C—Si and the like. Most desirable among these materials are a-SiC:H and a-SiN:H which have broad band gaps. The n-type semiconductor thin layer (5) allows incident light to pass therethrough and is formed of a conductive material. Examples of materials usable for the n-type semiconductor thin layer (5) include a-SiC, a-SiC:H, μc-SiC:H, and μc-Si:H which are used in solar batteries. Light-transmissible electrode (6) is formed of ITO, SnO$_2$ or the like. The light transmitted through light-transmissible electrode (6) is absorbed by the second i-type semiconductor thin layer (15) and generates electron-hole pairs. When a positive polarity voltage is applied to the light-transmissible electrode (6), the generated holes migrate toward the p-type impurity diffusion layer (3), and the electrons migrate toward light-transmissible electrode (6). The carrier generated in the second i-type semiconductor thin layer (15) produces an avalanche intensification while in movement, thereafter is fetched by the Al electrode (7) as intensified photocurrent. The Al electrode (7) is connected to an CCD analog shift register or logarithm conversion circuit or the like (not illustrated).

Figure 5:
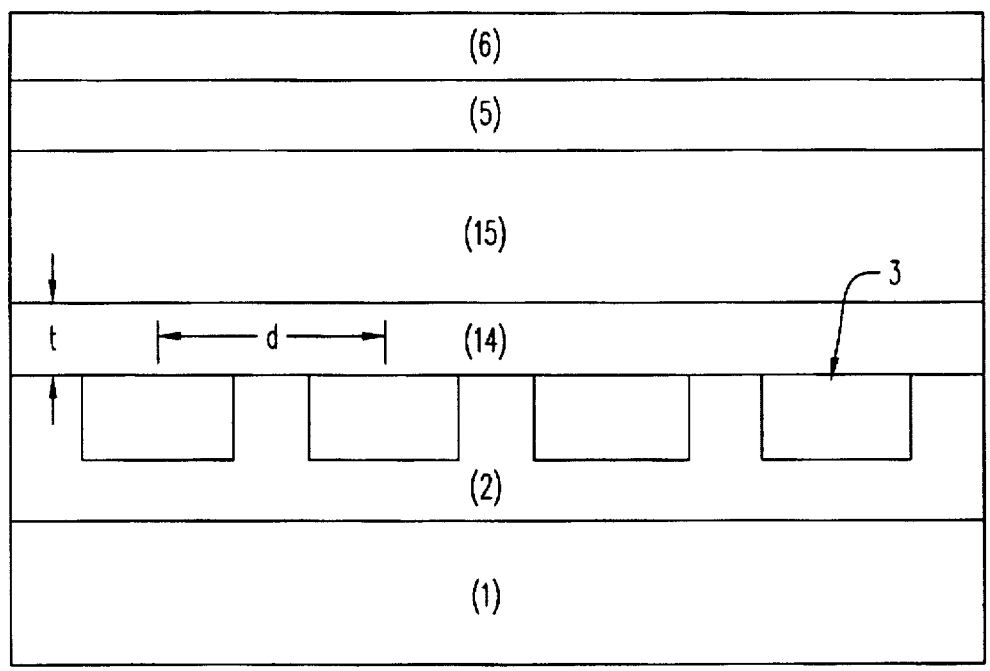
FIG. 5 shows one picture element formed by a p-type impurity diffusion layer (3) formed within an n well region (2), with a plurality of said picture elements being arrayed in a horizontal direction.

FIG. 5 shows one picture element formed by a p-type impurity diffusion layer (3) formed within an n well region (2), with a plurality of said picture elements being arrayed in a horizontal direction. FIG. 5 further shows that the first i-type semiconductor thin layer (14) is formed so as to be in contact with both the n well region (2) and p-type impurity diffusion layer (3) and so as to form a connecting configuration of each picture element. The carriers generated by photoelectric conversion in the second i-type semiconductor thin layer (15) arrives at the p-type impurity diffusion layer (3) without diffusion in a horizontal direction because of the high resistance of the first i-type semiconductor thin layer (14) and second i-type semiconductor thin layer (15), and the long distance d between picture elements compared to the thickness t of the thin layers. Concretely, the distance d is about between 5 and 10 μm, and the thickness t is about 1 μm.

Figure 6:
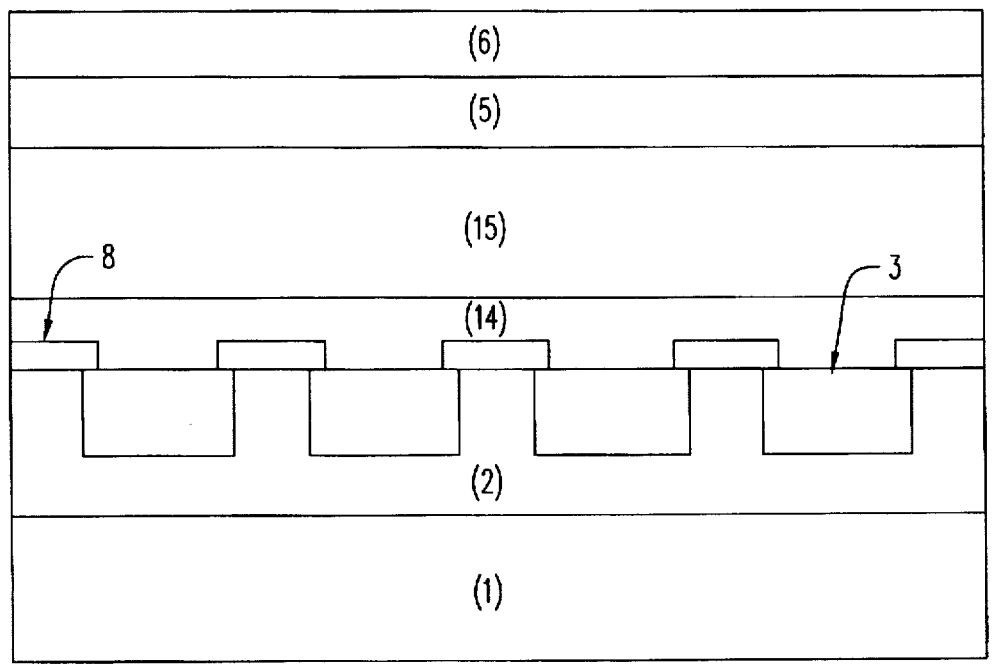
FIG. 6 shows a modification of the second embodiment.

FIG. 6 shows a modification of the second embodiment. In the second embodiment as shown in FIG. 5, the first i-type semiconductor thin layer (14) is formed so as to be in contact with both the n well region (2) and p-type impurity diffusion layer (3) and form a connecting configuration of each picture element. In this modification, however, the first i-type semiconductor thin layer (14) is formed so as to be in contact only with the p-type impurity diffusion layer (3) of the picture element portion. In this modification, the contact surface area is reduced between the first i-type semiconductor thin layer (14) and the impurity diffusion layer (3) formed on the substrate so as to better reduce the generation of dark current. Reference number (8) is an insulation layer formed of a thermal oxidation layer of SiO$_2$ or SiN.

Figure 7:
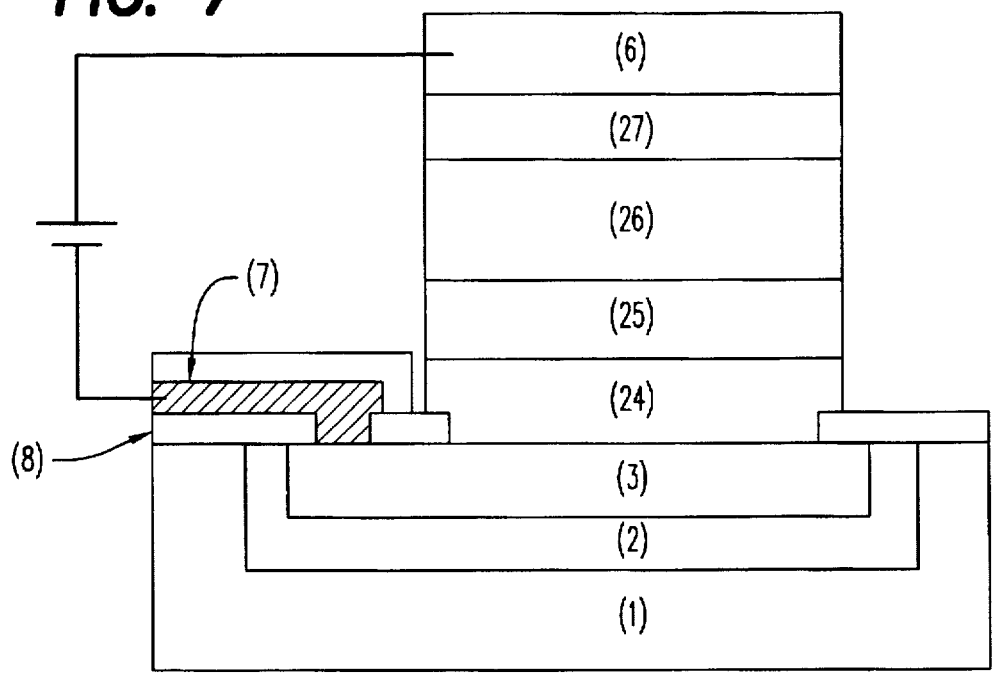
FIG. 7 shows the construction of the picture elements of a solid state image sensing device as a third embodiment according to the present invention.

FIG. 7 shows the construction of the picture element portion of a solid state image sensing device as a third embodiment according to the present invention. Points of departure of the third embodiment relative to the second embodiment are the construction of a laminate layer superimposed on the n well region (2) and p-type impurity diffusion layer (3), in other respects, the construction is identical to that of the second embodiment.

The laminate layers in the third embodiment comprise a first i-type semiconductor thin layer (24), first n-type semiconductor thin layer (25), second i-type semiconductor thin layer (26), and second n-type semiconductor thin layer (27).

The first i-type semiconductor thin layer (24) is formed of polysilicon, μc-Si, μc-Si:H, a-SiC:H, μc-SiC:H, a-SiN:H, C—Si and the like which has a large degree of migration of generated carriers. Most desirable among these materials are a-SiC:H and a-SiN:H which have a broad band gap.

The first n-type semiconductor thin layer (25) is formed of a-SiC, a-SiC:H, μc-SiC:H, μc-Si:H. The second i-type semiconductor thin layer (26) is a photoelectric conversion layer formed of a-Si:H or like material having a large visible light absorption coefficient so as to absorb all light. The second n-type semiconductor thin layer (27) is a hole injection blocking layer formed of an a-SiC layer. Light-transmissible electrode (6) is formed of ITO, SnO$_2$ or the like.

Light transmitted through light-transmissible electrode (6) is absorbed by the second i-type semiconductor thin layer (26) which is a photoelectric conversion layer and produces electron-hole pairs. When a positive polarity voltage is applied to the light-transmissible electrode (6), the generated holes migrate toward the p-type impurity diffusion layer (3), and the electrons migrate toward light-transmissible electrode (6). The first i-type semiconductor thin layer (24) holds all the voltage because said layer is sandwiched between the n-type semiconductor thin layer (25) and the p-type impurity diffusion layer (3). The carrier generated in the first i-type semiconductor thin layer produces an avalanche intensification while in movement, thereafter is fetched as a photocurrent by the Al electrode (7). Al electrode (7) is connected to a CCD analog shift register, logarithmic conversion circuit or the like (not illustrated).

Figure 8:
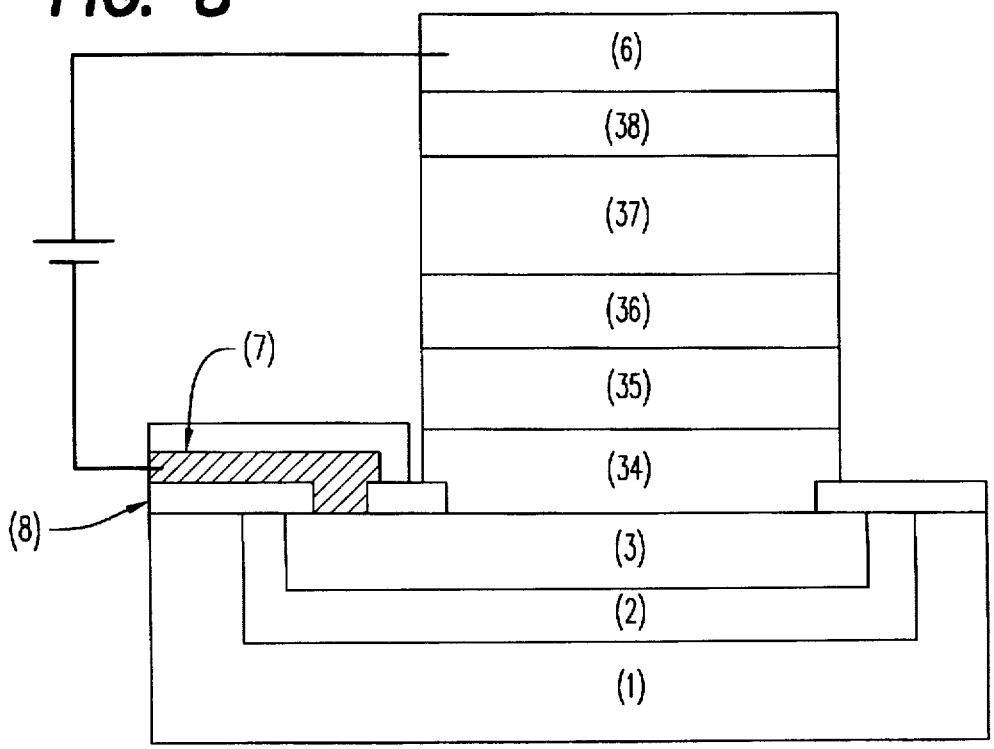
FIG. 8 shows the construction of the picture elements of a solid state image sensing device as a fourth embodiment according to the present invention.

FIG. 8 shows the construction of the picture element portion of a solid state image sensing device as a fourth embodiment according to the present invention. Points of departure of the fourth embodiment relative to the second embodiment are the construction of a laminate layer superimposed on the n well region (2) and p-type impurity diffusion layer (3), in other respects, the construction is identical to that of the second embodiment.

The laminate layers in the fourth embodiment comprise a first i-type semiconductor thin layer (34), second i-type semiconductor thin layer (35), first n-type semiconductor thin layer (36), third i-type semiconductor thin layer (37), and second n-type semiconductor thin layer (38).

The first i-type semiconductor thin layer (34) suppresses dark current generated by defects in the interface between the semiconductor thin layer and n well region (2) and p-type impurity diffusion layer (3), improves voltage resistance characteristics of the semiconductor thin layer, and functions as a blocking layer to block an injection current from the p-type impurity diffusion layer (3). First i-type semiconductor thin layer (34) is formed of a-SiC:H, μc-SiC:H, a-SiN:H, C—Si or the like. The third i-type semiconductor thin layer (37) is a photoelectric conversion layer formed of a-Si:H or like material having a large visible light absorption coefficient so as to absorb all light. The second i-type semiconductor thin layer (35) is an avalanche intensifying layer formed of μc-Si:H, polysilicon or the like which has a large degree of migration of the generated carriers. The first n-type semiconductor thin layer (36) is formed of a-SiC:H, μc-SiC:H, μc-Si:H or the like. In this construction, there is portion interposed between the n-type and p-type, such that the voltage is contained in the portion interposed between the n-type semiconductor thin layer (36) and p-type impurity diffusion layer (3).

The second n-type semiconductor thin layer (38) transmits incident light and is formed of a conductive material.

Examples of materials usable for the second n-type semiconductor thin layer (38) include a-SiC:H, μc-SiC:H, and μc-Si:H which are used in solar batteries.

The light transmitted through light-transmissible electrode (6) is absorbed by the third i-type semiconductor thin layer (37) and generates electron-hole pairs. When a positive polarity voltage is applied to the light-transmissible electrode (6), the generated holes migrate toward the p-type impurity diffusion layer (3), and the electrons migrate toward light-transmissible electrode (6). The carrier generated in the second i-type semiconductor thin layer (35) via the application of a high voltage produces an avalanche intensification, thereafter is fetched by the Al electrode (7) as intensified photocurrent. The Al electrode (7) is connected to an CCD analog shift register or logarithm conversion circuit or the like (not illustrated).

Figure 9:
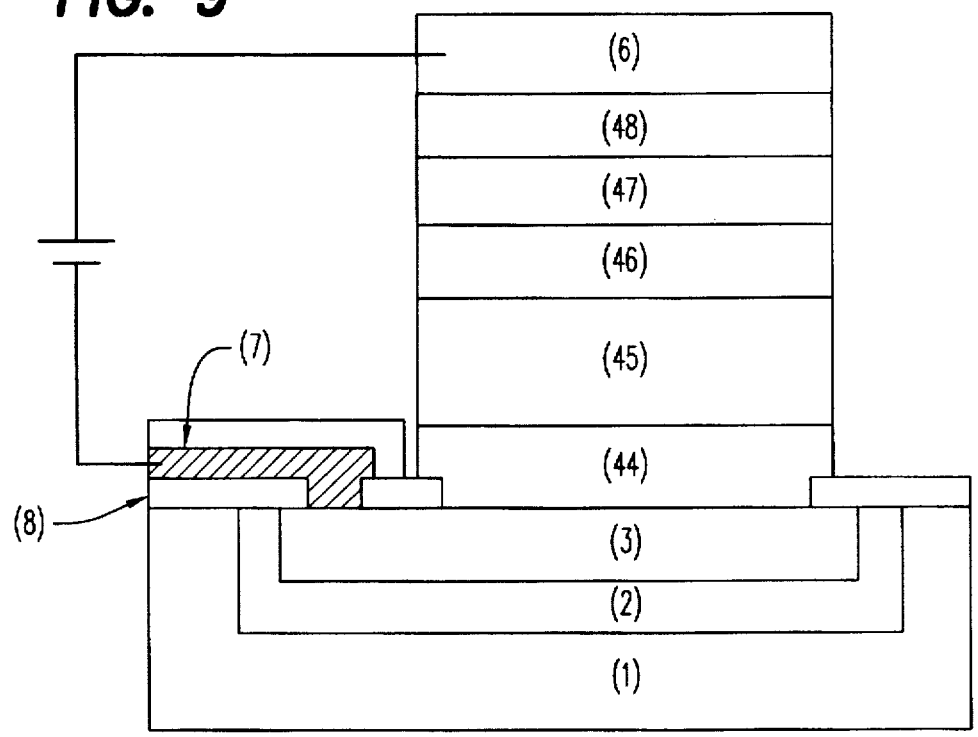
FIG. 9 shows the construction of the picture elements of a solid state image sensing device as a fifth embodiment to the present invention.

FIG. 9 shows the construction of the picture element portion of a solid state image sensing device as a fifth embodiment according to the present invention. The present embodiment, considers the case wherein the avalanche intensified carriers are electrons, whereas in the fourth embodiment as shown in FIG. 8 considers the case wherein the avalanche intensified carriers are holes. Reference number (44) refers to a first i-type semiconductor thin layer, (45) refers to a second i-type semiconductor thin layer, (46) refers to a p-type impurity diffusion layer, (47) refers to a third i-type semiconductor thin layer, and (48) refers to an n-type semiconductor thin layer. In other respects the construction of the fifth embodiment is identical to that of the second embodiment.

The first i-type semiconductor thin layer (44) suppresses dark current generated by defects in the interface between the semiconductor thin layer and n well region (2) and p-type impurity diffusion layer (3), improves voltage resistance characteristics of the semiconductor thin layer, and functions as a blocking layer to block an injection current from the p-type impurity diffusion layer (3). The second i-type semiconductor thin layer (45) is a photoelectric conversion layer formed of a-Si:H or the like having a large visible light absorption coefficient so as to absorb all light. The third i-type semiconductor layer (47) is an avalanche intensification layer formed of μc-Si:H, polysilicon or the like having a large degree of movement of carrier. The third i-type semiconductor thin layer (47) is interposed between the p-type semiconductor thin layer (46) and n-type semiconductor thin layer (48) to hold more voltage in third i-type semiconductor thin layer (48) than in the second i-type semiconductor thin layer (45) when a sufficient high reference voltage is applied. The p-type semiconductor thin layer (46) if formed of a-SiC:H, μc-SiC:H, μc-Si:H or the like. The n-type semiconductor thin layer (48) transmits incident light and is formed of a conductive material. Examples of materials usable for the n-type semiconductor thin layer (48) include a-SiC:H, μc-SiC:H, and μc-Si:H which are used in solar batteries.

The light transmitted through light-transmissible electrode (6) is absorbed by the second i-type semiconductor thin layer (45) and generates electron-hole pairs. When a positive polarity voltage is applied to the light-transmissible electrode (6), the generated holes migrate toward the p-type impurity diffusion layer (3), and the electrons migrate toward light-transmissible electrode (6). The electron in the third i-type semiconductor thin layer (47) to which a high voltage is applied produces an avalanche intensification, thereafter is fetched by the Al electrode (7) as intensified photocurrent. The Al electrode (7) is connected to an CCD analog shift register or logarithm conversion circuit or the like (not illustrated).

All the previously described embodiments allow for transposing the p-type and n-type layers. The respective embodiments shown in the Y–Y' cross section diagrams may be combined with the constructions shown in the X–X' cross section diagrams. The intensified photocurrent is fetched by the Al electrode (7) may be converted to a voltage proportional to a logarithm of an integral value of incident light intensity by a logarithm conversion circuit.

Although the second through fifth embodiments have described an avalanche intensification type semiconductor thin layer, a tunneling intensification type semiconductor thin layer may be used.

Figure 10:
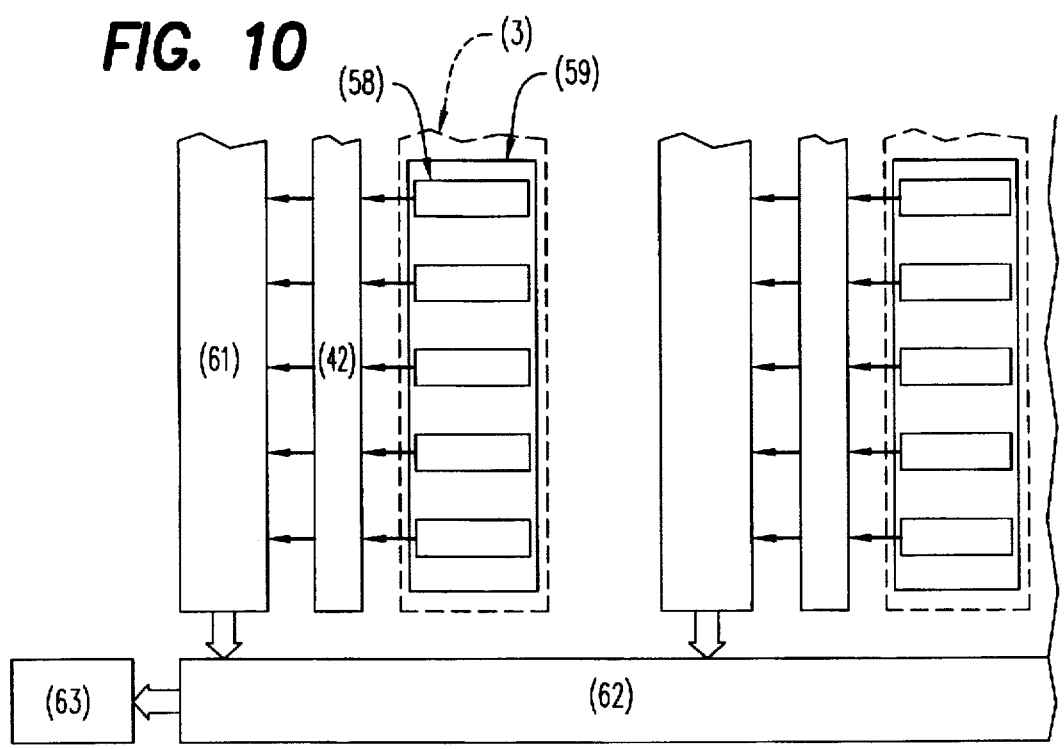
FIG. 10 is a conceptual drawing of a two-dimensional solid state image sensing device as a sixth embodiment according to the present invention.
Figure 11:
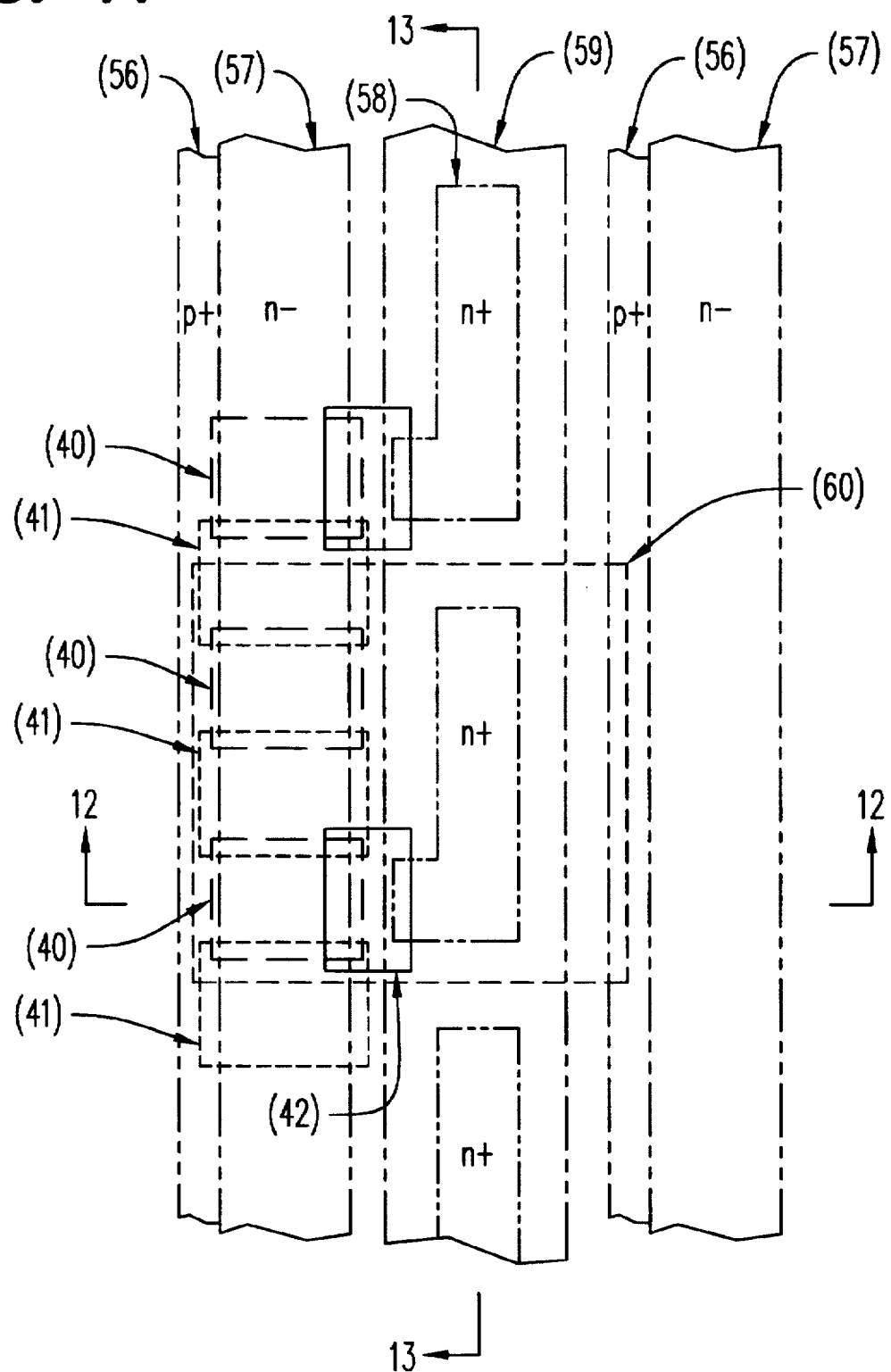
FIG. 11 is a plan view showing details of the periphery of a single unit picture element (60)
Figure 12:
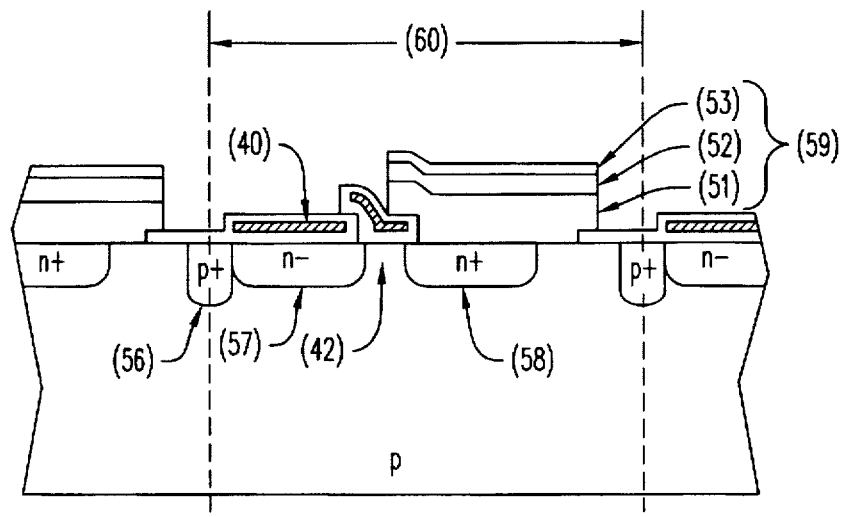
FIG. 12 shows a X-X' section view of the device of FIG. 11.
Figure 13:
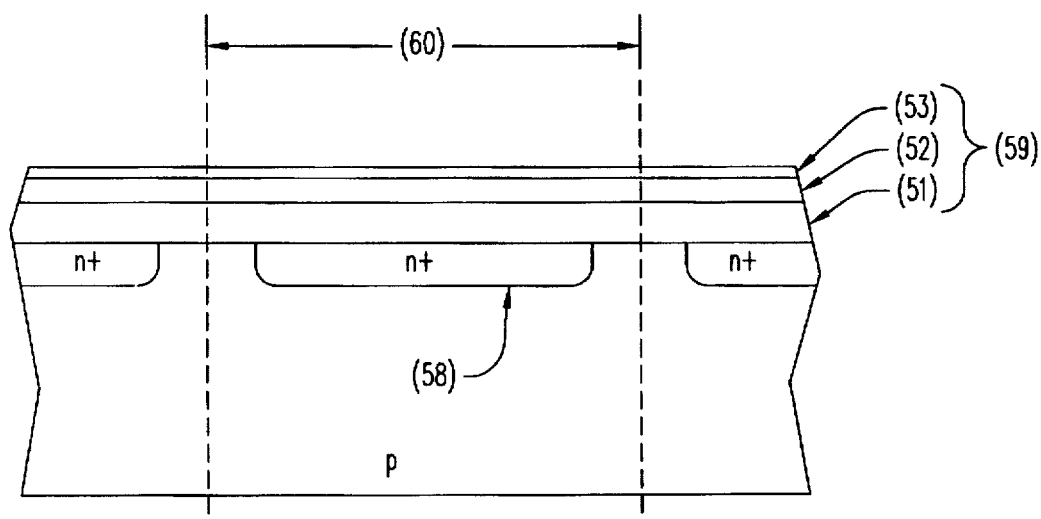
FIG. 13 shows a Y-Y' section view of the device of FIG. 11.

FIGS. 10 and 11 show the construction of a two-dimensional solid state image sensing device as a sixth embodiment according to the present invention. FIG. 10 is a conceptual drawing of the sixth embodiment. FIG. 11 is a plan view showing details of the periphery of a single unit picture element (60). FIG. 12 is an X–X' cross section view, and FIG. 13 is a Y–Y' cross section view of the device of FIG. 10.

As shown in FIG. 12, the solid state image sensing device as the sixth embodiment is provided with a p-type silicon substrate upon which are formed by an ion implantation or thermal diffusion an n-type embedded diffusion layer (57) comprising a vertical shift register, p-type diffusion layer (56) comprising an element separation region, and n-type diffusion layer (58) comprising a picture element electrode. A semiconductor laminate layer (59) is formed on n-type diffusion layer (58) by direct plasma CVD. Reference numbers (40) and (41) refer to first layer and second layer polysilicon electrodes of the respective vertical shift registers, which can apply a drive voltage to the shift register from an external power source via wiring of a metal material such as aluminum or the like not shown in the drawing. Reference number (42) refers to a shift gate for transmitting signals to the shift register and is formed by the third polysilicon electrode. Semiconductor laminate layer (59) comprises an i-type semiconductor thin layer (51), p-type semiconductor thin layer (52), and light-transmissible electrode (53), and is identical to the semiconductor laminate layer of the first embodiment. Light is transmitted through light-transmissible electrode (53), passes through p-type semiconductor thin layer (52), and is absorbed by i-type semiconductor thin layer (51) which is a photoelectric conversion layer, thereby generating electron-hole pairs. When a negative polarity voltage is applied to the light-transmissible electrode (53), the generated holes migrate toward the p-type semiconductor thin layer (52), and the electrons migrate toward the n-type diffusion layer (58) which forms the picture element electrode. As shown in FIG. 10, the signal electrons collect in n-type diffusion layer (58), and when a readout timing pulse is applied to the third polysilicon electrode (42), it passes through shift gate (42) and is read from vertical register (61), and transmitted to horizontal shift register (62) and output circuit (63) for output as an image signal.

Figure 14:
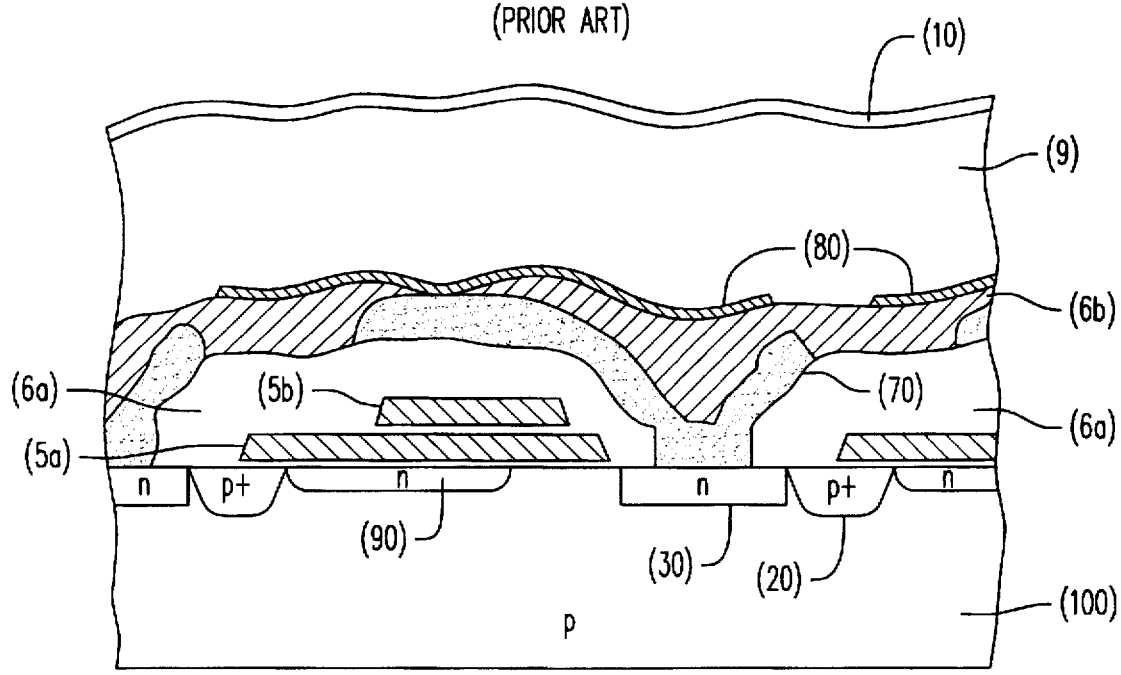
FIG. 14 shows the cross section construction of one picture element of a conventional two-dimensional solid state image sensing device.

FIG. 14 shows the construction of the cross section of one picture element of a conventional two-dimensional solid state image sensing device. In FIG. 14, reference number (100) refers to a p-type silicon substrate, (20) refers to a p-type diffusion layer forming an element separation region, (30) refers to a storage diode comprising an n-type impurity region, (90) refers to a CCD channel region comprising an n-type impurity region. A leader electrode (70) is formed on channel region (90). A surface flattening second insulation layer (6b) is formed on leader electrode (70) and insulation layer (6a), and on said insulation layer (6b) is formed a picture element electrode (80) corresponding to each single picture element. A semiconductor thin layer (9) comprising a-Si:H (i-type noncrystalline hydrogenated silicon) as a photoelectric conversion element is formed on the picture element electrode (80), and on said semiconductor thin layer (9) is formed a light-transmissible electrode (10).

In the conventional two-dimensional solid state image sensing device shown in FIG. 14, when a light-receiving portion is comprised of a semiconductor laminate layer, a first insulation layer (6a), storage diode (30), leader electrode (70), and surface flattening second insulation layer (6b) are required. In the device as the sixth embodiment according to the present invention, however, the process for producing the light-receiving portion is simplified because the roles of the storage diode and picture element electrode are performed by the n-type diffusion layer (58) alone. As shown in FIG. 13, the surface of n-type diffusion layer (58) is flat, such that there is no electrical dispersion from the semiconductor laminate layer (59) formed on n-type diffusion layer (58). Furthermore, dark current generation is effectively prevented by forming the n-type diffusion layer (58) directly on a silicon substrate.

Although the construction of the semiconductor laminate layer (59) is identical to that f the first embodiment, the construction of the second or third embodiments may be used. When a semiconductor laminate layer having a construction similar to that of the second and third embodiments is used, there is an improvement of the characteristics of the photocurrent intensification type semiconductor laminate layer which is readily susceptible to breakdown due to layer quality and non-flatness of the surface of the laminate layer.

Figure 15:
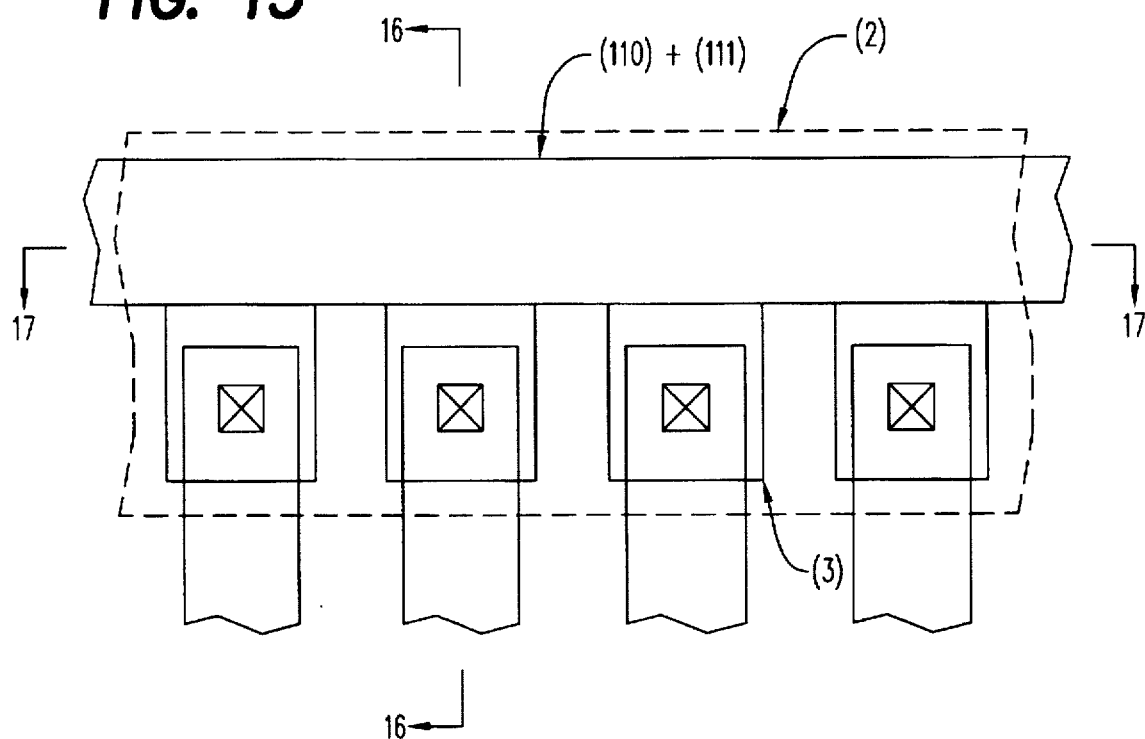
FIG. 15 is a plan view showing the construction of the picture elements of a solid state image sensing device as a seventh embodiment according to the present invention.
Figure 16:
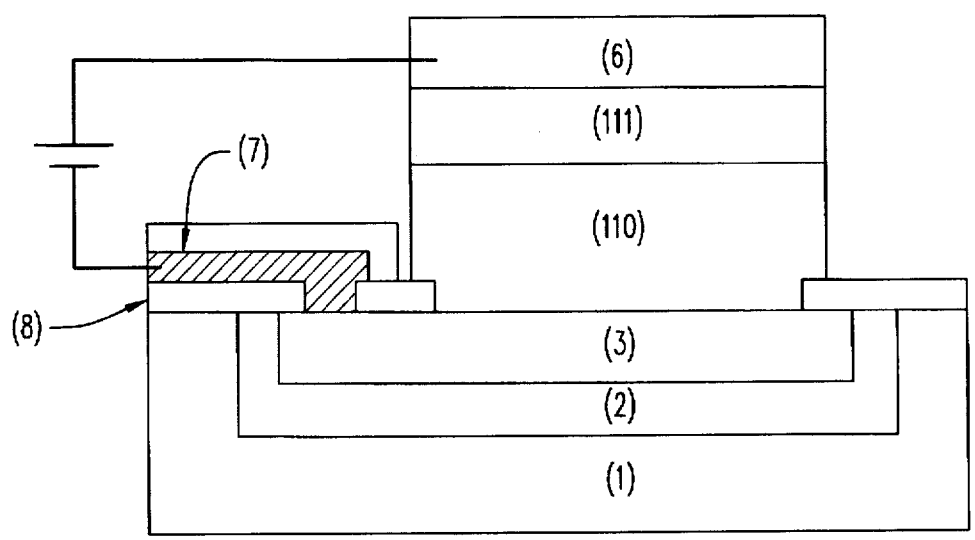
FIG. 16 shows a Y-Y' section view of the device of FIG. 15.
Figure 17:
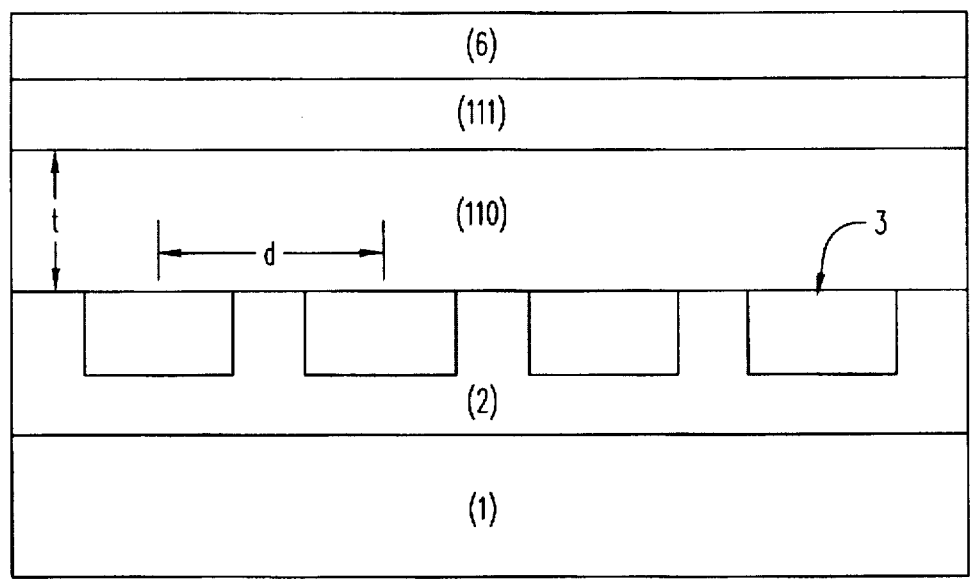
FIG. 17 shows a X-X' section view of the device of FIG. 15.
Figure 18:
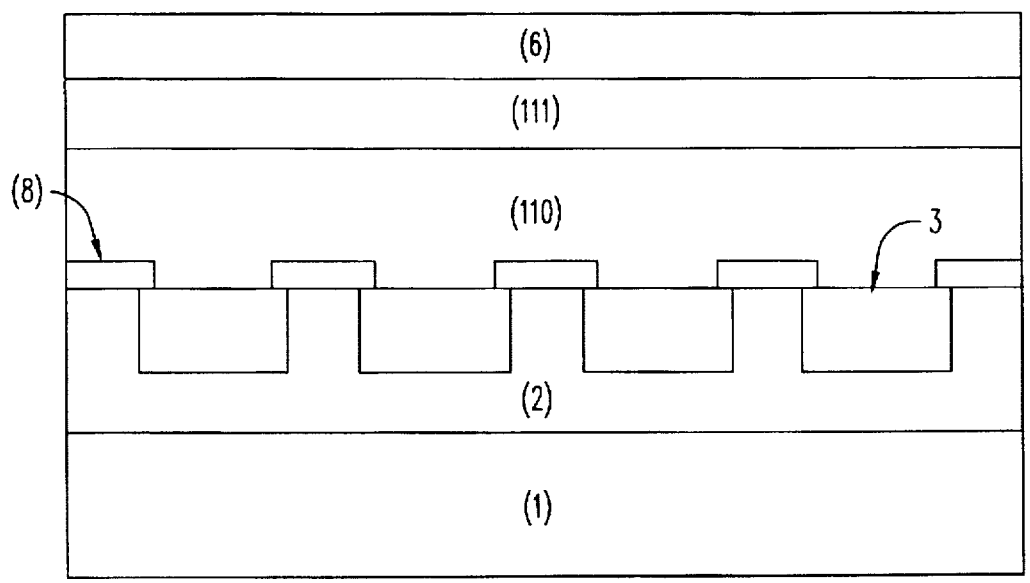
FIG. 18 shows a modification of the seventh embodiment.

The unidimensional solid state image sensing device as a seventh embodiment according to the present invention is described hereinafter. FIG. 15 is a plan view showing the construction of the picture element portion of a solid state image sensing device as a seventh embodiment according to the present invention. FIG. 16 is a Y-Y' cross section view, and FIGS. 17 and 18 are X-X' cross section views of the device of FIG. 15. In the seventh embodiment, reference number (1) refers to a p-type semiconductor substrate, (2) refers to an n well region formed by ion implantation or thermal diffusion on a p-type semiconductor substrate, (3) refers to a p-type impurity diffusion layer formed by ion implantation or thermal diffusion within n well region (2), (110) refers to an i-type semiconductor thin layer, (111) refers to an n-type semiconductor thin layer, (6) refers to a light-transmissible electrode, and (7) refers to an Al electrode. The i-type semiconductor thin layer (110) is formed of a-Si:H, μc-Si:H, polysilicon or the like having a large visible light absorption coefficient. N-type semiconductor thin layer (111) transits incident light and is formed of a conductive material such as, for example, a-SiC:H, μc-SiC:H, and μc-Si:H which are used in solar batteries. Light-transmissible electrode (6) is formed of ITO, SnO₂ or the like. The light transmitted through light-transmissible electrode (6) is absorbed by i-type semiconductor thin layer (110), and generates electron-hole pairs. When a positive polarity voltage is applied to the light-transmissible electrode (6), the generated holes migrate toward the p-type impurity diffusion layer (3), and the electrons migrate toward light-transmissible electrode (6). The carrier generated in the i-type semiconductor thin layer (110) is fetched by the Al electrode (7) as a photocurrent. The Al electrode (7) is connected to an CCD analog shift register or logarithm conversion circuit or the like (not illustrated).

FIG. 17 shows one picture element formed by a p-type impurity diffusion layer (3) formed within an n well region (2), with a plurality of said picture elements being arrayed in a horizontal direction. FIG. 17 further shows that the i-type semiconductor thin layer (110) is formed so as to be in contact with both the n well region (2) and p-type impurity diffusion layer (3) and so as to form a connecting configuration of each picture element. The carrier generated by photoelectric conversion in the i-type semiconductor thin layer (110) arrives at the p-type impurity diffusion layer (3) without diffusion in a horizontal direction because of the high resistance of the i-type semiconductor thin layer (110) and the long distance d between picture elements compared to the thickness t of the thin layers. Concretely, the distance d is about between 5 and 10 μm, and the thickness t is about 1 μm as shown in FIG. 17.

Figure 19A:
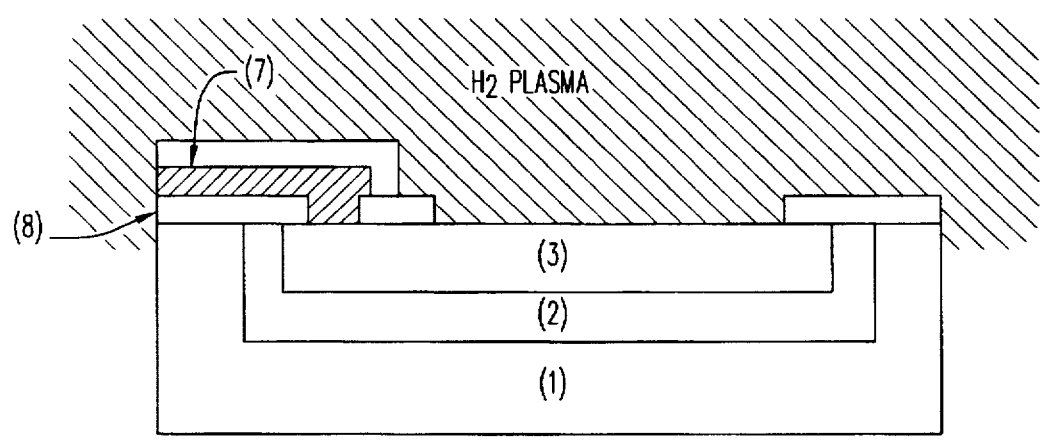
FIG. 19(a) shows the hydrogen plasma process in the seventh embodiment.

FIG. 18 shows a modification of the seventh embodiment. In the present modification, only the p-type impurity diffusion layer (3) which is the picture element portion is in contact, whereas in the seventh embodiment of FIG. 17 the i-type semiconductor thin layer (110) is formed so as to be in contact with both the n well region (2) and p-type impurity diffusion layer (3) and so as to form a connecting configuration of each picture element. In this modification, the contact surface area is reduced between the laminates semiconductor layer and the impurity diffusion layer formed on the substrate so as to better reduce the generation of dark current in the photoconductive layer. The method of producing the solid state image sensing device of the seventh embodiment is described hereinafter with reference to FIG. 19. FIG. 19(a) shows the hydrogen plasma process, FIG. 19(b) shows the semiconductor thin layer forming process, and FIG. 19(c) shows the light-transmissible electrode forming process of the top electrode.

Figure 19B:
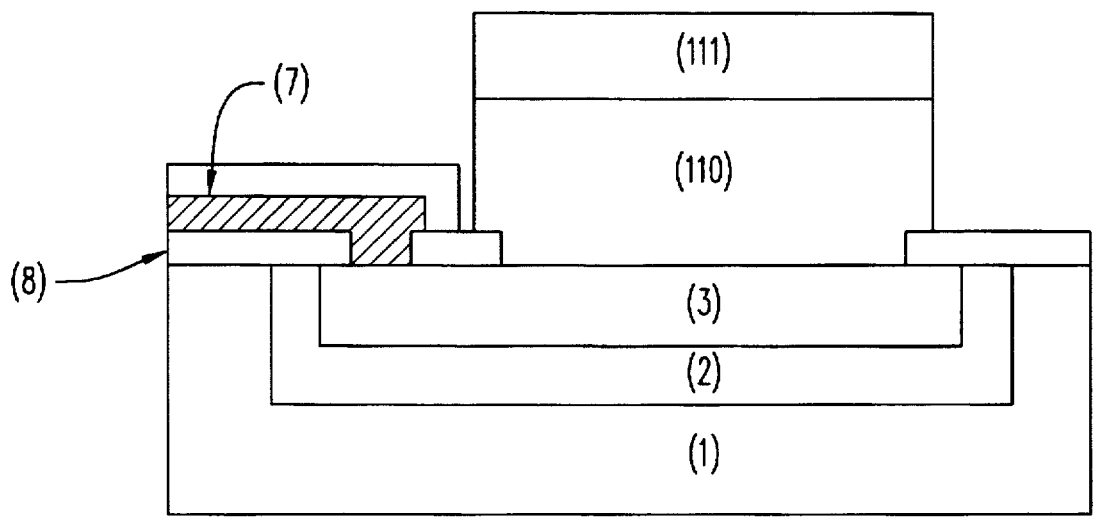
FIG. 19(b) shows the semiconductor thin layer forming process in the seventh embodiment.
Figure 19C:
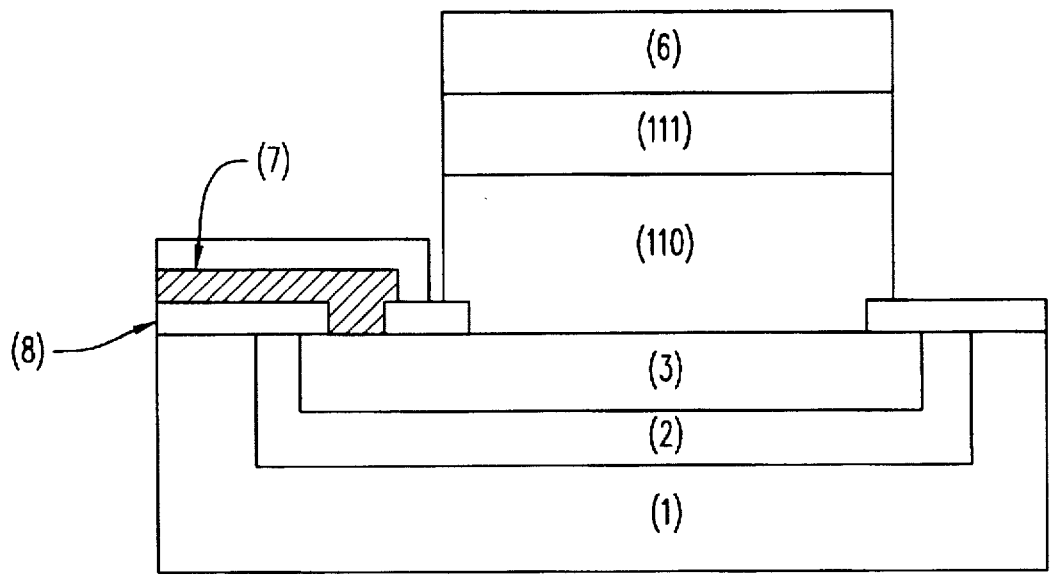
FIG. 19(c) shows light-transmissible electrode forming process in the seventh embodiment.

FIGS. 19(a) and 19(b) illustrate the interior of the same plasma CVD apparatus, and FIG. 19(c) illustrates the production process within an electron beam vapor deposition apparatus.

Processes (a) and (b) are executed consecutively in a vacuum state. First, a substrate having a light-receiving portion which is formed by wet or dry etching and on which a semiconductor thin layer is formed is set in a plasma CVD apparatus, and the device is evacuated to form a vacuum. When a sufficient vacuum has been formed, hydrogen gas is introduced into the chamber, and plasma discharge conditions are set so as to achieve sufficient contact of the hydrogen plasma on the substrate as shown in process (a). Thereafter, a semiconductor thin layer is sequentially formed as shown in process (b). Then, the vacuum is released, and a light-transmissible electrode layer is formed by an electron beam vapor deposition device as shown in process (c).

Figure 20:
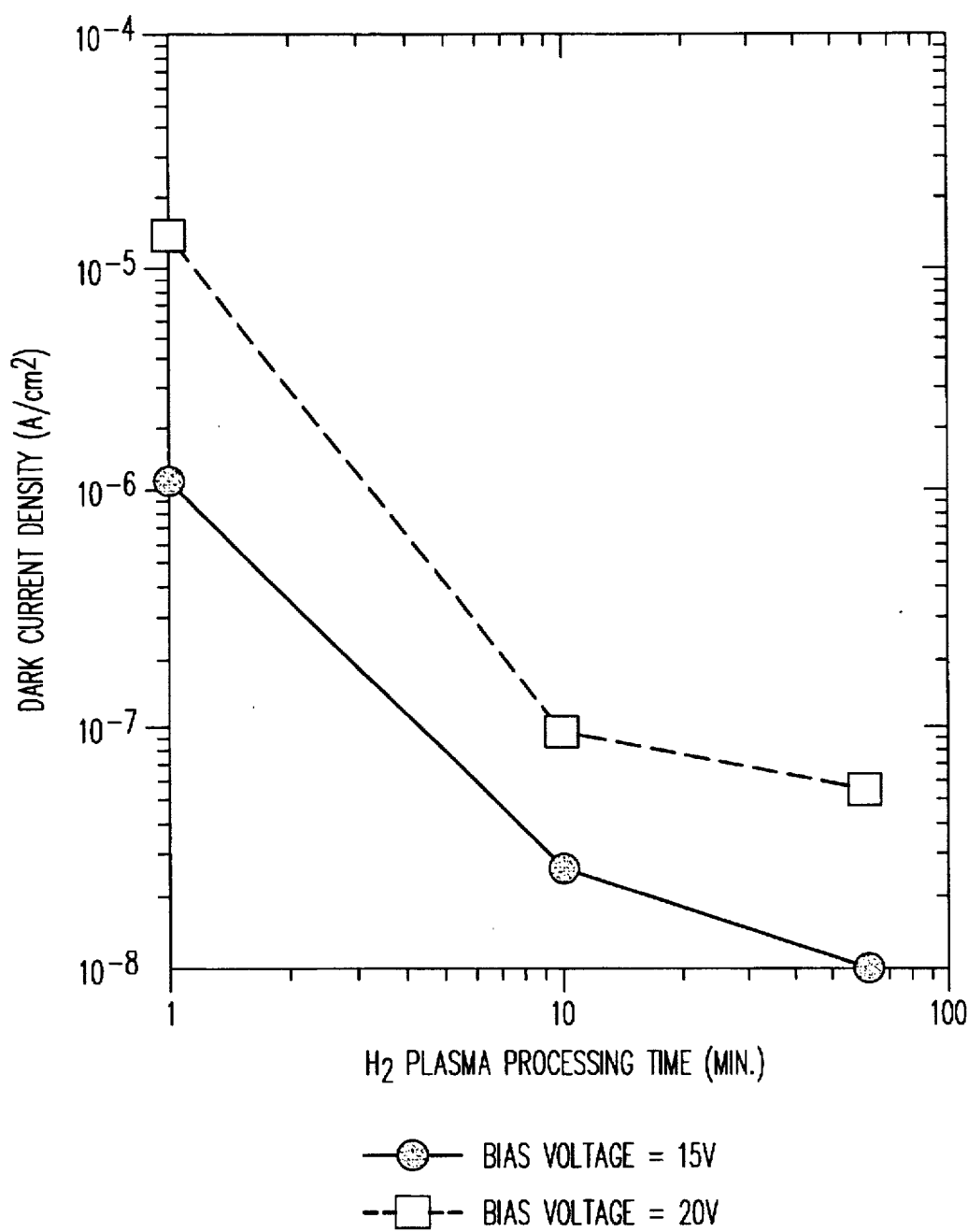
FIG. 20 shows the influence of the time of hydrogen plasma processing of the surface of the p-type impurity diffusion layer and n well region on the dark current.
Figure 20:
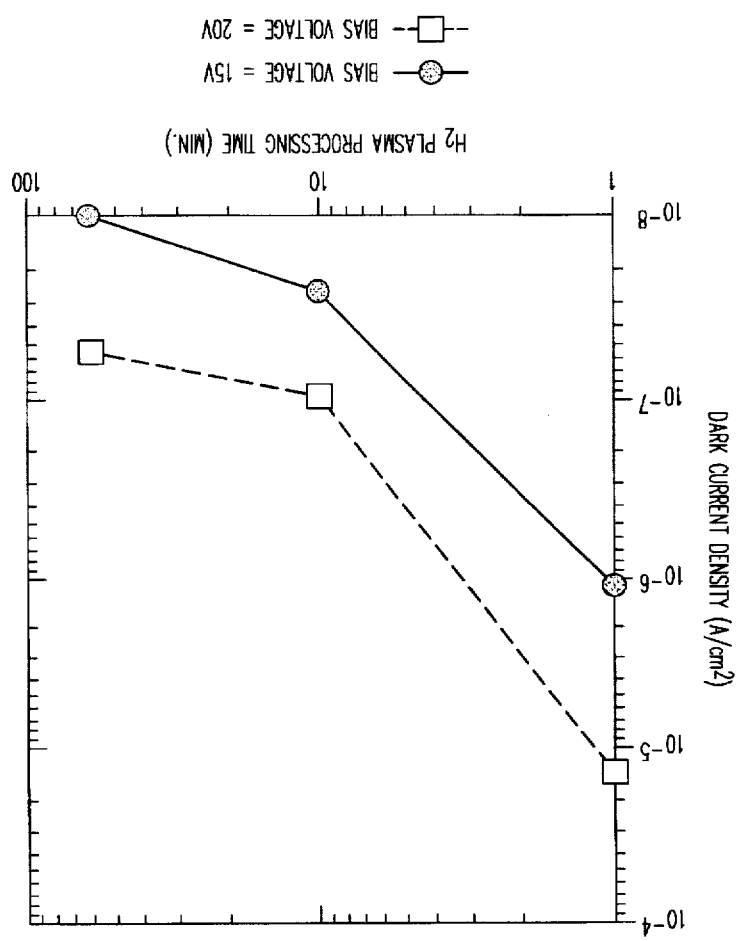

FIG. 20 shows the influence of the time of the hydrogen plasma processing of the surface of the p-type impurity diffusion layer and n well region on the dark current. Under identical discharge conditions, longer processing time improved problems occurring in the interface between the semiconductor thin layer and the n well region (2) and p-type impurity diffusion layer (3) such as dangling bonds and defects, and was very effective in suppressing dark current. Accordingly, the high voltage required for photocurrent intensification, e.g., avalanche intensification, can be applied to the aforesaid semiconductor thin layer.

The solid state image sensing device as the seventh embodiment according to the present invention as described above improves problems occurring at the interface between the semiconductor thin layer, n well region (2) and p-type impurity diffusion layer (3) due to dangling bonds and defects by a hydrogen plasma process applied to the surface of both the n well region (2) and the p-type impurity diffusion layer (3) prior to forming the i-type semiconductor thin layer (110), thereby the occurrence of suppressing dark current and allowing the application of a high voltage required for photocurrent intensification, e.g., avalanche intensification, to the semiconductor thin layer acting as a photoelectric conversion layer.

Although the plasma processing is applied to the surfaces of both the n well region (2) and the p-type impurity diffusion layer (3) prior to forming the i-type semiconductor thin layer (110) in the seventh embodiment, such plasma processing may be applied to the p-type impurity diffusion layer (3) alone to attain similar effect.

Further, the above plasma processing may be applied to both the n well region (2) and the p-type impurity diffusion layer (3) or the p-type impurity diffusion layer (3) alone in the first through sixth embodiments according to the present invention.

Although the present invention has been fully described by way of examples with reference to the accompanying drawing, it is to be noted that various changes and modifications will be apparent to those skilled in the art. Therefore, unless other wise such changes and modifications depart from the scope of the present invention, they should be construed as being included therein.

What is claimed is:

1. A solid state image sensing device comprising:

a semiconductor substrate;

a first diffusion region of a p-type or n-type conductivity provided on said semiconductor substrate;

a plurality of second diffusion regions each of which is of an opposite conductivity type relative to said first diffusion region and is provided in said first diffusion region; and a semiconductor thin film deposited directly on a plane which consists of said first diffusion region and said plurality of second diffusion regions so as to contact each of said first diffusion region and said plurality of second diffusion regions.

2. A solid state image sensing device as claimed in claim 1 wherein said semiconductor thin layer includes an avalanche multiplication type semiconductor thin layer or a tunneling multiplication type semiconductor thin layer.

3. A solid state image sensing device as claimed in claim 1 wherein the semiconductor substrate includes a p-type semiconductor substrate, the first diffusion region includes a n well region, the second diffusion region includes p-type impurity diffusion region, and the semiconductor thin film includes an i-type semiconductor thin film and a n-type semiconductor thin layer formed on the i-type semiconductor thin layer.

4. A solid state image sensing device as claimed in claim 3, further comprising:

a light-transmissible electrode provided on the n-type semiconductor thin layer.

5. A solid state image sensing device as claimed in claim 3 wherein the i-type semiconductor thin layer is formed of semiconductor materials without doping.

6. A solid state image sensing device as claimed in claim 4 wherein the n-type semiconductor thin layer is formed of a-SiC, a-SiC:H, μc-SiC:H or μc-Si:H, and the light-transmissible electrode is formed of ITO or $SnO_2$.

7. A solid state image sensing device as claimed in claim 5 wherein the i-type semiconductor thin layer is formed of a-Si:H, μc-Si, polysilicon, or mono-crystalline Si.

8. A photoelectric conversion portion provided in a solid state image sensing device comprising:

a semiconductor substrate;

a first diffusion region of a p-type or n-type conductivity provided on said semiconductor substrate;

a plurality of second diffusion regions each of which is of an opposite conductivity type relative to said first diffusion region and is provided in said first diffusion region; and a semiconductor thin film deposited directly on a plane which consists of said first diffusion region and said plurality of second diffusion regions so as to contact each of said first diffusion region and said plurality of second diffusion regions.

9. A photoelectric conversion portion as claimed in claim 8 wherein said semiconductor thin film includes an avalanche multiplication type semiconductor thin film or a tunneling multiplication type semiconductor thin film.

10. A solid state image sensing device comprising:

a semiconductor substrate having a first diffusion region and a plurality of second diffusion regions at the surface thereof, said first diffusion region being a p-type or n-type conductive type, and said second diffusion regions being an opposite conductive type relative to the first diffusion region and provided in the first diffusion region, said first and second diffusion regions together forming a flat surface of the substrate; and a semiconductor thin film having a plurality of semiconductor layers formed over said semiconductor substrate, said plurality of layers including a first semiconductor layer deposited directly on said semiconductor substrate and a second semiconductor layer provided on said first semiconductor layer, said first and second semiconductor layers being formed by different semiconductor materials without doping, wherein said first semiconductor layer physically contacts the plurality of second diffusion regions.

11. A solid state image sensing device as claimed in claim 10 wherein said semiconductor thin film includes an avalanche multiplication type semiconductor thin film or a tunneling multiplication type semiconductor thin film.

12. A solid state image sensing device as claimed in claim 10, further comprising:

a light-transmissible electrode provided on uppermost layer of the layers included in the semiconductor thin film.

13. A solid state image sensing device as claimed in claim 10 wherein said first layer of the semiconductor thin film contacts with at least the second diffusion region.

14. A solid state image sensing device as claimed in claim 10 wherein the semiconductor substrate includes a p-type semiconductor substrate, the first diffusion region includes a n well region, the second diffusion region includes a p-type impurity diffusion region, the first layer of the semiconductor thin film includes a first i-type semiconductor thin layer, and the second layer of the semiconductor thin film includes a second i-type semiconductor thin layer formed on said first i-type semiconductor thin layer.

15. A solid state image sensing device as claimed in claim 14 wherein the semiconductor thin film further includes a n-type semiconductor thin layer provided on the second i-type semiconductor thin layer.

16. A solid state image sensing device as claimed in claim 14 wherein the first i-type semiconductor thin layer is formed of polysilicon, μc-Si, μc-Si:H, a-SiC:H, μc-SiC:H, a-SiN:H or C—Si.

17. A photoelectric conversion portion provided in a solid state image sensing device, said photoelectric conversion portion comprising:

a semiconductor substrate having a flat surface and a plurality of pixels in a line, said pixels forming part of the flat surface of the substrate; and a semiconductor thin film having a plurality of layers formed over said plurality of pixels of said semiconductor substrate, said plurality of layers including a first layer deposited directly on said semiconductor substrate and a second layer provided on said first layer which are formed by different semiconductor materials without doping, said first layer being continuous along the line of pixels and physically contacting each of the pixels.

18. A photoelectric conversion portion as claimed in claim 17 wherein the semiconductor substrate has a first diffusion region and a plurality of second diffusion regions corresponding to said plurality of pixels at the surface thereof, said first diffusion region being a p-type or n-type conductive type, and said plurality of second diffusion regions being an opposite conductive type relative to the first diffusion region and provided in the first diffusion region.

19. A solid state image sensing device as claimed in claim 1 wherein the device is a linear solid state image sensing device.

20. A solid state image sensing device as claimed in claim 19 wherein said semiconductor thin film includes an avalanche multiplication type semiconductor thin film or a tunneling multiplication type semiconductor thin film.

21. A solid state image sensing device comprising:

a semiconductor substrate having a flat surface and a plurality of pixels in a line, said pixels forming part of the flat surface of the substrate; and a semiconductor thin film having a plurality of layers formed over said plurality of pixels of said semiconductor substrate, said plurality of layers including a first layer deposited directly on said semiconductor substrate and a second layer provided on said first layer which are formed by different semiconductor materials without doping, said first layer being continuous along the line of pixels and physically contacting each of the pixels.

22. A solid state image sensing device as claimed in claim 21 wherein the semiconductor substrate has a first diffusion region and a plurality of second diffusion regions corresponding to said plurality of pixels at the surface thereof, said first diffusion region having a p-type or n-type conductivity, and said plurality of second diffusion regions having an opposite conductivity type relative to the first diffusion region and being provided in the first diffusion region.

23. A solid state image sensing device as claimed in claim 21 wherein said semiconductor thin film includes an avalanche multiplication type semiconductor thin layer or a tunneling multiplication type semiconductor thin layer.

24. A solid state image sensing device as claimed in claim 21, further comprising:

a light-transmissible electrode provided on the uppermost layer of the layers included in the semiconductor thin film.

25. A solid state image sensing device comprising:

a semiconductor substrate having a flat surface and a plurality of pixels in a line, said semiconductor substrate having a first diffusion region and a plurality of second diffusion regions corresponding to the plurality of pixels, said second diffusion regions being provided in said first diffusion region and having an opposite conductivity type relative to the first diffusion region, said first and second diffusion regions together forming the flat surface of the substrate; and a semiconductor thin film having a plurality of layers formed over the pixels of said semiconductor substrate, said plurality of layers including a first layer deposited directly on said semiconductor substrate and a second layer provided on the first layer which are formed by different semiconductor materials without doping, said first layer being continuous along the line of pixels and physically contacting each of the pixels.

26. A solid state image sensing device comprising:

a semiconductor substrate having a flat surface and a plurality of pixels in a line, said substrate having a first diffusion region and a plurality of second diffusion regions corresponding to the pixels, said second diffusion regions having an opposite conductivity type relative to the first diffusion region and being provided in said first diffusion region, said first and second diffusion regions forming part of the flat surface of the substrate; and a semiconductor thin film deposited directly on the surface of the substrate, said thin film being continuous along the line of the pixels and physically contacting each of the pixels.

27. The solid state image sensing device as claimed in claim 26 wherein said semiconductor thin film includes an uppermost semiconductor layer having an opposite conductivity type relative to the second diffusion regions of the substrate.

28. A solid state image sensing device as claimed in claim 14 wherein the semiconductor thin layer further includes a p-type semiconductor thin layer provided on the second i-type semiconductor thin layer, a third i-type semiconductor thin layer provided on said p-type semiconductor thin layer, and a n-type semiconductor thin layer provided on the third i-type semiconductor thin layer.

29. A solid state image sensing device as claimed in claim 15 wherein the semiconductor thin layer further includes a second n-type semiconductor thin layer between the first i-type semiconductor thin layer and the second i-type semiconductor thin layer.

30. A solid state image sensing device as claimed in claim 15 wherein the semiconductor thin layer further includes a third i-type semiconductor thin layer provided on the n-type semiconductor thin layer, and a second n-type semiconductor thin layer provided on said third i-type semiconductor thin layer.

* * * * *